US008557682B2

(12) United States Patent
Holden et al.

(10) Patent No.: US 8,557,682 B2
(45) Date of Patent: Oct. 15, 2013

(54) MULTI-LAYER MASK FOR SUBSTRATE DICING BY LASER AND PLASMA ETCH

(75) Inventors: James M. Holden, San Jose, CA (US);
Wei-Sheng Lei, San Jose, CA (US);
Brad Eaton, Menlo Park, CA (US);
Todd Egan, Fremont, CA (US);
Saravjeet Singh, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 224 days.

(21) Appl. No.: 13/161,427

(22) Filed: Jun. 15, 2011

(65) Prior Publication Data
US 2012/0322241 A1 Dec. 20, 2012

(51) Int. Cl.
*H01L 21/00* (2006.01)
(52) U.S. Cl.
USPC ........... 438/462; 438/460; 438/950; 438/951; 438/970; 257/E21.599
(58) Field of Classification Search
USPC ................ 438/460, 462, 463, 950, 951, 970; 257/E21.599
See application file for complete search history.

(56) References Cited

U.S. PATENT DOCUMENTS

| 4,049,944 | A | 9/1977 | Garvin et al. |
| 5,593,606 | A | 1/1997 | Owen et al. |
| 6,057,180 | A | 5/2000 | Sun et al. |
| 6,117,347 | A | 9/2000 | Ishida |
| 6,174,271 | B1 | 1/2001 | Kosmowski |
| 6,306,731 | B1 | 10/2001 | Igarashi et al. |
| 6,407,363 | B2 | 6/2002 | Dunsky et al. |
| 6,465,158 | B1 | 10/2002 | Sekiya |
| 6,528,864 | B1 | 3/2003 | Arai |
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |

(Continued)

FOREIGN PATENT DOCUMENTS

| JP | 9216085 | 8/1997 |
| JP | 10321908 | 12/1998 |

(Continued)

OTHER PUBLICATIONS

Restriction Requirement for U.S. Appl. No. 13/180,336 dated Sep. 11, 2012, 6 pages.

(Continued)

*Primary Examiner* — Leonard Chang
(74) *Attorney, Agent, or Firm* — Blakely, Sokoloff, Taylor and Zafman LLP

(57) ABSTRACT

Methods of dicing substrates having a plurality of ICs. A method includes forming a multi-layered mask comprising a first mask material layer soluble in a solvent over the semiconductor substrate and a second mask material layer, insoluble in the solvent, over the first mask material layer. The multi-layered mask is patterned with a laser scribing process to provide a patterned mask with gaps. The patterning exposes regions of the substrate between the ICs. The substrate is then plasma etched through the gaps in the patterned mask to singulate the IC with the second mask material layer protecting the first mask material layer for at least a portion of the plasma etch. The soluble material layer is dissolved subsequent to singulation to remove the multi-layered mask.

15 Claims, 10 Drawing Sheets

(56) References Cited

U.S. PATENT DOCUMENTS

| | | |
|---|---|---|
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 * | 3/2009 | Mancini et al. ........ 438/459 |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 2001/0035401 A1 | 11/2001 | Manor |
| 2002/0012345 A1 | 1/2002 | Kalkunte et al. |
| 2002/0042189 A1 | 4/2002 | Tanaka |
| 2003/0045101 A1 | 3/2003 | Flanner et al. |
| 2003/0152756 A1 | 8/2003 | Yamada et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0259329 A1 | 12/2004 | Boyle et al. |
| 2006/0024924 A1 | 2/2006 | Haji et al. |
| 2006/0043535 A1 | 3/2006 | Hiatt |
| 2006/0205182 A1 | 9/2006 | Soejima |
| 2007/0272555 A1 | 11/2007 | Baird |
| 2007/0272666 A1 | 11/2007 | O'Brien et al. |
| 2008/0283848 A1 | 11/2008 | Yamazaki |
| 2009/0176375 A1 | 7/2009 | Benson et al. |
| 2009/0255911 A1 | 10/2009 | Krishnaswami et al. |
| 2009/0321748 A1 | 12/2009 | Lee |
| 2010/0025387 A1 | 2/2010 | Arai et al. |
| 2010/0048001 A1 | 2/2010 | Harikai et al. |
| 2010/0120227 A1 | 5/2010 | Grivna et al. |
| 2010/0120230 A1 | 5/2010 | Grivna et al. |
| 2010/0246611 A1 | 9/2010 | Sun |
| 2011/0029124 A1 | 2/2011 | Boyle et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2007281526 | 10/2007 |
| JP | 2009034694 | 2/2009 |
| JP | 2010165963 | 7/2010 |
| KR | 20100020727 | 2/2010 |
| WO | WO-03036712 | 5/2003 |
| WO | WO-03071591 | 5/2003 |
| WO | WO-2011163149 | 12/2011 |
| WO | WO-2012173758 | 12/2012 |
| WO | WO-2012173759 | 12/2012 |
| WO | WO-2012173768 | 12/2012 |
| WO | WO-2012173770 | 12/2012 |

OTHER PUBLICATIONS

International Search Report and Written Opinion from PCT/US2012/040303 mailed Dec. 28, 2012, 9 pgs.

Restriction Requirement for U.S. Appl. No. 13/161,006 Mailed Jan. 10, 2013, 6 Pages.

International Search Report and Written Opinion for PCT Patent Application No. PCT/US2012/040295 Mailed Dec. 27, 2012, 11 Pages.

Restriction Requirement for U.S. Appl. No. 13/161,026 Mailed Jan. 17, 2013, 6 Pages.

International Search Report and Written Opinion from PCT/US2012/040307 mailed Dec. 28, 2012, 9 pgs.

International Search Report and Written Opinion for PCT Patent Application No. PCT/US2012/039746 Mailed Dec. 26, 2012, 10 Pages.

Restriction Requirement for U.S. Appl. No. 13/161,036 Mailed Feb. 1, 2013, 6 Pages.

Restriction Requirement for U.S. Appl. No. 13/160,973 Mailed Jan. 9, 2013, 6 Pages.

International Search Report and Written Opinion for PCT Patent Application No. PCT/US2012/039207 Mailed Dec. 26, 2012, 12 Pages.

International Search Report and Written Opinion for PCT Patent Application No. PCT/US2012/039209 Mailed Dec. 26, 2012, 8 Pages.

International Search Report and Written Opinion for PCT Patent Application No. PCT/US2012/039205 Mailed Dec. 26, 2012, 11 Pages.

International Search Report and Written Opinion for PCT Patent Application No. PCT/US2012/039753 Mailed Dec. 26, 2012, 9 Pages.

International Search Report and Written Opinion for PCT Patent Application No. PCT/US2012/040289 Mailed Jan. 2, 2013, 11 Pages.

International Search Report and Written Opinion for PCT Patent Application No. PCT/US2011/041126 Mailed Feb. 21, 2012, 10 Pages.

International Preliminary Report on Patentability for PCT Patent Application No. PCT/US2011/041126 Mailed Jan. 10, 2013, 7 Pages.

Restriction Requirement for U.S. Appl. No. 13/161,045 Mailed Feb. 19, 2013, 5 Pages.

Van Borkulo, Jeroen et al., "Enabling Technology in Thin Wafer Dicing", The Electrochemical Society, vol. 18, Issue 1, Packaging Technology, 2009, pp. 837-842.

Non-Final Office Action for U.S. Appl. No. 13/180,336 Mailed Feb. 6, 2013, 15 Pages.

Linder, et al., "Water-Soluble Sacrificial Layers for Surface Micromachining", www.small-journal.com, 2005, 1, No. 7, 7 Pages.

Singh, et al., "Apparatus and Methods for Dry Etch With Edge, Side and Back Protection", U.S. Appl. No. 61/491,693, filed May 31, 2011 24 pgs.

* cited by examiner

MULTI-LAYER MASK FOR SUBSTRATE DICING BY LASER AND PLASMA ETCH

TECHNICAL FIELD

Embodiments of the present invention pertain to the field of semiconductor processing and, in particular, to masking methods for dicing substrates, each substrate having an integrated circuit (IC) thereon.

BACKGROUND DESCRIPTION OF RELATED ART

In semiconductor substrate processing, ICs are formed on a substrate (also referred to as a wafer), typically composed of silicon or other semiconductor material. In general, thin film layers of various materials which are either semiconducting, conducting or insulating are utilized to form the ICs. These materials are doped, deposited and etched using various well-known processes to simultaneously form a plurality of ICs, such as memory devices, logic devices, photovoltaic devices, etc, in parallel on a same substrate.

Following device formation, the substrate is mounted on a supporting member such as an adhesive film stretched across a film frame and the substrate is "diced" to separate each individual device or "die" from one another for packaging, etc. Currently, the two most popular dicing techniques are scribing and sawing. For scribing, a diamond tipped scribe is moved across a substrate surface along pre-formed scribe lines. Upon the application of pressure, such as with a roller, the substrate separates along the scribe lines. For sawing, a diamond tipped saw cuts the substrate along the streets. For thin substrate singulation, such as <150 μm thick bulk silicon singulation, the conventional approaches have yielded only poor process quality. Some of the challenges that may be faced when singulating die from thin substrates may include microcrack formation or delamination between different layers, chipping of inorganic dielectric layers, retention of strict kerf width control, or precise ablation depth control.

While plasma dicing has also been contemplated, a standard lithography operation for patterning resist may render implementation cost prohibitive. Another limitation possibly hampering implementation of plasma dicing is that plasma processing of commonly encountered metals (e.g., copper) in dicing along streets can create product issues or throughput limits. Finally, masking of the plasma dicing process may be problematic, depending on, inter alia, the thickness and top surface topography of the substrate, the selectivity of the plasma etch, and removal of the mask selectively from the materials present on the top surface of the substrate.

SUMMARY

Embodiments of the present invention include methods of masking semiconductor substrates for a hybrid dicing process including both laser scribing and plasma etching.

In an embodiment, a method of dicing a semiconductor substrate having a plurality of ICs includes forming a mask over the semiconductor substrate, the mask including a plurality of distinct material layers covering and protecting the ICs. The mask is patterned with a laser scribing process to provide a patterned mask with gaps, exposing regions of the substrate between the ICs. The substrate is then plasma etched through the gaps in the patterned mask to singulate the ICs into chips.

In another embodiment, a system for dicing a semiconductor substrate includes a femtosecond laser; a plasma etch chamber, and a mask deposition module, coupled to a same platform.

In another embodiment, a method of dicing a substrate having a plurality of ICs includes forming a bi-layer mask including a soluble material layer, such as poly (vinyl-alcohol) over a front side of a silicon substrate. Over the soluble material layer is a non-soluble material layer, such as photoresist or polyimide (PI). The bi-layer mask covers and protects ICs disposed on the front side of the substrate. The ICs include a copper bumped top surface having bumps surrounded by a passivation layer, such as polyimide (PI). Subsurface thin films below the bumps and passivation include a low-κ interlayer dielectric (ILD) layer and a layer of copper interconnect. The bi-layer mask, the passivation layer, and subsurface thin films are patterned with a femtosecond laser scribing process to expose regions of the silicon substrate between the ICs. The silicon substrate is etched through the gaps with a deep silicon plasma etch process to singulate the ICs and the bi-layer mask is then wet processed to dissolve the soluble layer and lift off the non-soluble layer.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
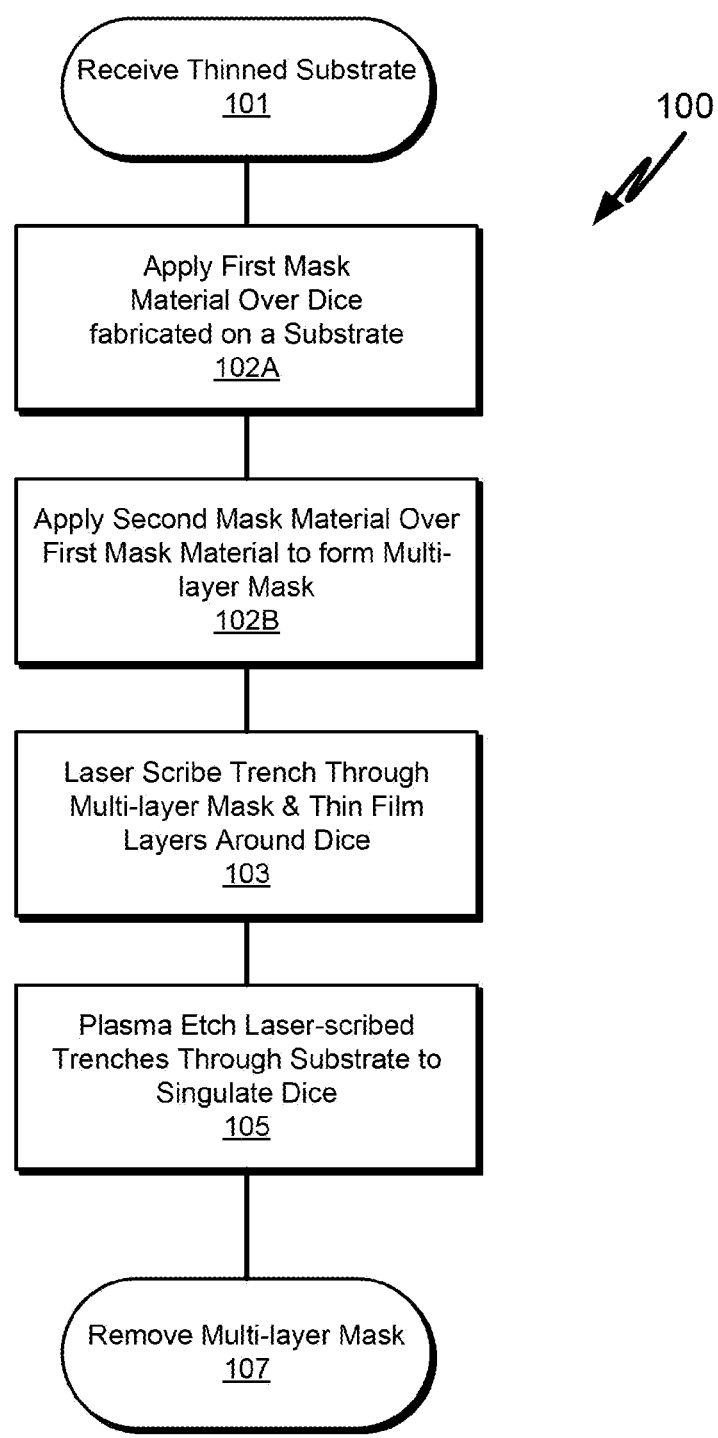
FIG. 1 is a flow diagram illustrating a hybrid laser ablation-plasma etch singulation method, in accordance with an embodiment of the present invention.

Methods and apparatuses for dicing substrates are described. In the following description, numerous specific details are set forth, such as femtosecond laser scribing and deep silicon plasma etching conditions in order to describe exemplary embodiments of the present invention. However, it will be apparent to one skilled in the art that embodiments of the present invention may be practiced without these specific details. In other instances, well-known aspects, such as IC fabrication, substrate thinning, taping, etc., are not described in detail to avoid unnecessarily obscuring embodiments of the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Generally, a hybrid substrate or substrate dicing process involving an initial laser scribe and subsequent plasma etch is implemented with a multi-layered mask for die singulation. The laser scribe process may be used to cleanly remove an unpatterned (i.e., blanket) mask including at least two layers, a passivation layer, and subsurface thin film device layers along streets between adjacent ICs. The laser ablation process may then be terminated upon exposure of, or partial ablation of, the substrate. The plasma etch portion of the hybrid dicing process then etches through the bulk of the substrate, such as through bulk single crystalline silicon, for singulation or dicing of chips.

In accordance with an embodiment of the present invention, a combination of femtosecond laser scribing and plasma etching is used to dice a semiconductor substrate into individualized or singulated ICs. In one embodiment, femtosecond laser scribing is an essentially, if not completely, a non-equilibrium process. For example, the femtosecond-based laser scribing may be localized with a negligible thermal damage zone. In an embodiment, laser scribing is used to singulate ICs having ultra-low κ films (i.e., with a dielectric constant below 3.0). In one embodiment, direct writing with laser eliminates a lithography patterning operation, allowing the masking material to be something other than a photo resist as is used in photolithography, and a plasma etch-through the bulk of the substrate. In one embodiment, substantially anisotropic etching is used to complete the dicing process in a plasma etch chamber; the anisotropic etch achieving a high directionality into the substrate by depositing an etch polymer on sidewalls of the etched trench.

FIG. 1 is a flow diagram illustrating a hybrid laser ablation-plasma etch singulation process 100, in accordance with an embodiment of the present invention. FIGS. 4A-4D illustrate cross-sectional views of a substrate 406 including first and second ICs 425, 426 corresponding to the operations in method 100, in accordance with an embodiment of the present invention.

Figure 4A:
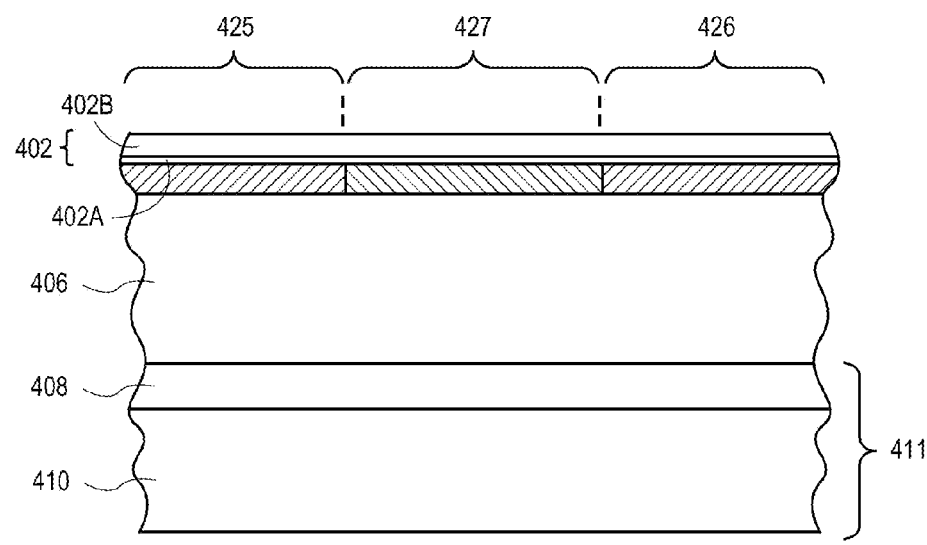
FIG. 4A illustrates a cross-sectional view of a semiconductor substrate including a plurality of ICs corresponding to operations 102A and 102B of the dicing method illustrated in FIG. 1, in accordance with an embodiment of the present invention.

Referring to operation 102A of FIG. 1, and corresponding FIG. 4A, a first mask material 402A of a multi-layered mask 402 is formed above a substrate 406. Generally, substrate 406 is composed of any material suitable to withstand a fabrication process of the thin film device layers formed thereon. For example, in one embodiment, substrate 406 is a group IV-based material such as, but not limited to, monocrystalline silicon, germanium or silicon/germanium. In another embodiment, substrate 406 is a III-V material such as, e.g., a III-V material substrate used in the fabrication of light emitting diodes (LEDs). During device fabrication, the substrate 406 is typically 600 µm-800 µm thick, but as illustrated in FIG. 4A may have been thinned to 100 µm or even to 50 µm with the thinned substrate now supported by a carrier, such as a backing tape 410 stretched across a support structure of a dicing frame (not illustrated) and adhered to a backside of the substrate with a die attach film (DAF) 408.

In embodiments, first and second ICs 425, 426 include memory devices or complimentary metal-oxide-semiconductor (CMOS) transistors fabricated in a silicon substrate 406 and encased in a dielectric stack. A plurality of metal interconnects may be formed above the devices or transistors, and in surrounding dielectric layers, and may be used to electrically couple the devices or transistors to form the ICs 425, 426. Materials making up the street 427 may be similar to or the same as those materials used to form the ICs 425, 426. For example, street 427 may include thin film layers of dielectric materials, semiconductor materials, and metallization. In one embodiment, the street 427 includes a test device similar to the ICs 425, 426. The width of the street 427 may be anywhere between 10 µm and 200 µm, measured at the thin film device layer stack/substrate interface.

In embodiments, the multi-layered mask 402 is a bi-layer with the first mask material layer 402A formed at operation 102A to be in contact with a top surface of the ICs 425, 426. The multi-layered mask 402 also covers the intervening street 427 between the ICs 425, 426. At operation 102B, a second mask material layer 402B is disposed on the first mask material layer 402A. In further embodiments, additional mask layers may be applied. The first mask material layer 402A is to provide a means for removing the second mask material layer 402B from a top surface of the ICs 425, 426 while the second mask material layer 402B is to provide additional protection to the top surface of the ICs 425, 426 (and to the first mask material layer 402A) during the hybrid laser ablation-plasma etch singulation process 100 (FIG. 1). The multi-layered mask 402 is unpatterned prior to the laser scribing operation 103 with the laser scribe to perform a direct writing of the scribe lines by ablating portions of the multi-layered mask 402 disposed over the street 427.

Figure 5:
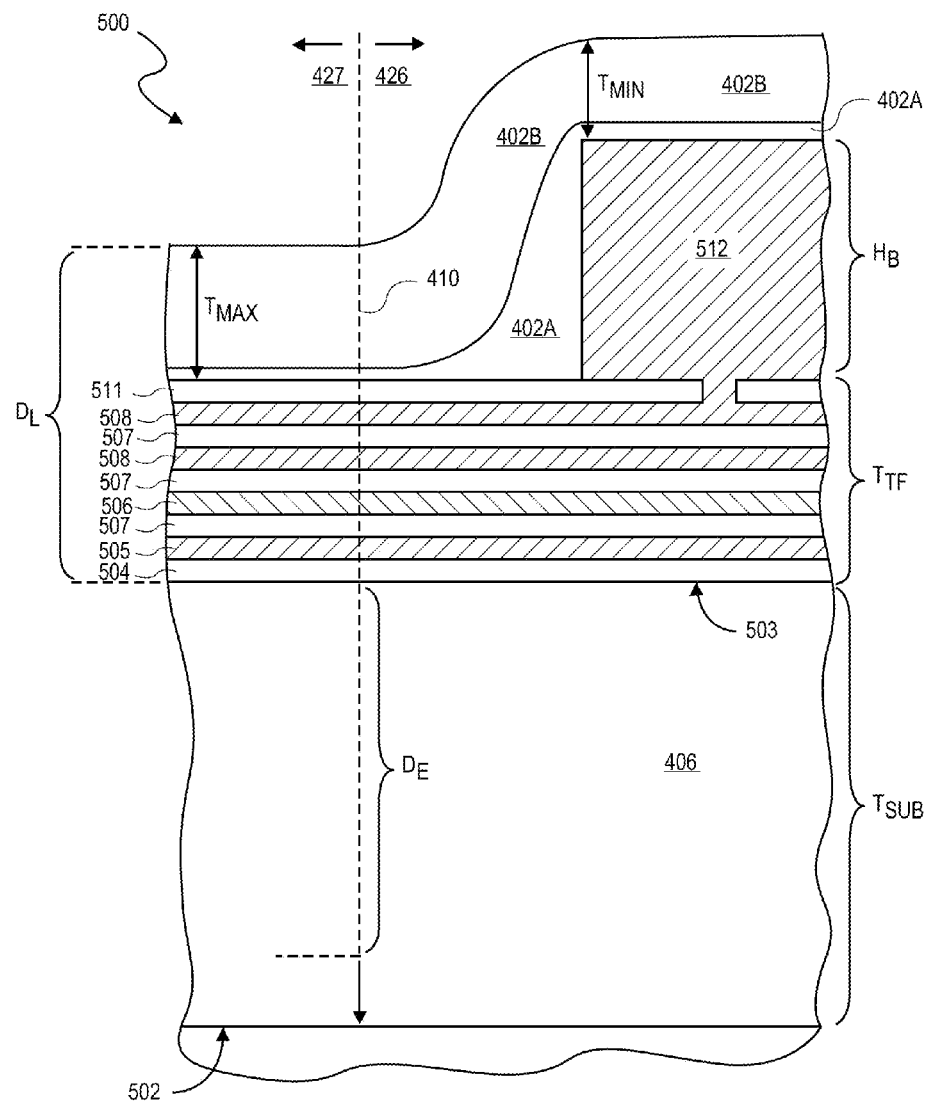
FIG. 5 illustrates a cross-sectional view of a water soluble mask applied to over a top surface and subsurface thin films of a substrate including a plurality of ICs, in accordance with embodiments of the present invention.

FIG. 5 illustrates an expanded cross-sectional view 500 of one exemplary embodiment including a first mask material layer 402A in contact with a top surface of the IC 426 and the street 427. As shown in FIG. 5, the substrate 406 has a top surface 503 upon which thin film device layers are disposed which is opposite a bottom surface 502 which interfaces with the DAF 408 (FIG. 4A). Generally, the thin film device layer materials may include, but are not limited to, organic materials (e.g., polymers), metals, or inorganic dielectrics such as silicon dioxide and silicon nitride. The exemplary thin film device layers illustrated in FIG. 5 include a silicon dioxide layer 504, a silicon nitride layer 505, copper interconnect layers 508 with low-κ (e.g., less than 3.5) or ultra low-κ (e.g., less than 3.0) interlayer dielectric layers (ILD) 507, such as carbon doped oxide (CDO), disposed there between. A top surface of the IC 426 includes a bump 512, typically copper, surrounded by a passivation layer 511, typically a polyimide (PI) or similar polymer. The bumps 512 and passivation layer 511 therefore make up a top surface of the IC with the thin film device layers forming subsurface IC layers. The bump 512 extends from a top surface of the passivation layer 511 by a bump height $H_B$ which in the exemplary embodiments ranges between 10 μm and 50 μm.

With the first mask material layer 402A covered by a second mask material layer 402B, the first mask material layer 402A may function either as a means of undercutting the second mask material layer 402B so that it may be lifted off from the underlying passivation layer 511, bump 512, or as a barrier protecting the passivation layer 511 and/or bump 512 from the process used to strip the second mask material layer 402B. Because the first mask material layer 402A covers the bump 412, the lift off will completely remove the multi-layered mask. The second material composition and thickness may then be freely designed to survive the plasma etch process even over the very tall bump 512 (which, being copper, may be damaged, oxidized, or otherwise contaminated if exposed to the plasma) without being constrained by the mask stripping.

Referring to FIG. 5, in the street, the maximum thickness $T_{max}$ of the multi-layered mask 402 in the street 427 is generally limited by the ability of a laser to pattern through the mask by ablation. The multi-layered mask 402 may be much thicker over the ICs 425, 426 and or edges of the street 427 where no street pattern is to be formed. As such, $T_{max}$ is a function of laser power and the optical conversion efficiency associated with laser wavelength. As $T_{max}$ is associated with the street 427, street feature topography, street width, and the method of applying the multi-layered mask 402 may be designed to limit $T_{max}$ to a thickness which can be ablated along with underlying thin film device layers in one or more laser passes, depending on throughput requirements. In particular embodiments, the multi-layered mask 402 has a street mask thickness $T_{max}$ which is less than 30 μm and advantageously less than 20 μm with a thicker mask calling for multiple laser passes. In particular embodiments, the first mask material layer 402A is thinner than the second mask material layer 402B. For exemplary embodiments, the first mask material layer 402A is not more than half the thickness of the second mask material layer 402B (e.g., the first mask material layer 402A accounts for no more than half of the street mask thickness $T_{max}$).

As further shown in FIG. 5, the minimum thickness $T_{min}$ of the multi-layered mask 402, found on a top surface of the bump 512 (being of most extreme topography), is a function of the selectivity achieved by the subsequent plasma etch (e.g., operation 105 in FIG. 1) over the second mask material layer 402B. The plasma etch selectivity is dependent on at least both the material/composition of the second mask material layer 402B and the etch process employed.

As oxidative plasma cleans, acidic etchants, and many other conventional mask stripping processes may not be compatible with the bump 512 and/or passivation layer 511, in an embodiment, the first mask material layer 402A is a polymer soluble in a solvent which is selective to, the underlying passivation layer 511 and/or bump 512. In a further embodiment, the first mask material layer 402A is also thermally stable to at least 60° C., preferably stable at 100° C., and ideally stable to 120° C. to avoid excessive crosslinking during the subsequent formation of the second mask layer or plasma etch process when the material's temperature will be elevated (e.g., through application of plasma power. Generally, excessive crosslinking adversely affects the solubility of the material, making removal of the multi-layered mask 402 more difficult.

In one embodiment, the first mask material layer 402A is of a material soluble in water. In one such embodiment, the water soluble material comprises a water soluble polymer. Selection of water soluble material for the present invention is complicated by thermal stability requirements, mechanics of applying/removing the material to/from the substrate, and IC contamination concerns. Exemplary water soluble materials having sufficient thermal stability include any of: poly(vinyl alcohol), poly(acrylic acid), poly(methacrylic acid), poly(acrylamide), poly(ethylene oxide), or the like. For the exemplary embodiment employing PVA, thermal stability has been confirmed for 60° C. with solubility decreasing as the temperature approaches 150° C. As such, for a PVA embodiment, processing after operation 102A until the multi-layered mask 402 is removed (i.e., plasma etching of the street 427) advantageously maintains the first mask layer 402A at a temperature below 150° C., preferably below 100° C., and ideally below 80° C.

In another embodiment, the first mask material layer 402A is soluble in any commercially available aqueous or hydrocarbon wet cleaning agent compatible with the materials employed for the passivation layer 511 and bump 512. Exemplary mask materials include non-photosensitive organic polymeric materials, such as any of those listed above where sufficient crosslinking has occurred to require a solvent such as isopropyl alcohol (IPA), tramethylammonium hydroxide (TMAH), etc.

Depending on the embodiment, the first mask material layer 402A is wet applied onto the substrate 406 to cover the passivation layer 511 and bump 512, vapor deposited, or applied as a dry film laminate. In a first embodiment, the first mask material layer 402A is merely sprayed onto the substrate. In a further embodiment, the first mask material layer 402A spin coated onto the substrate.

Figure 2A:
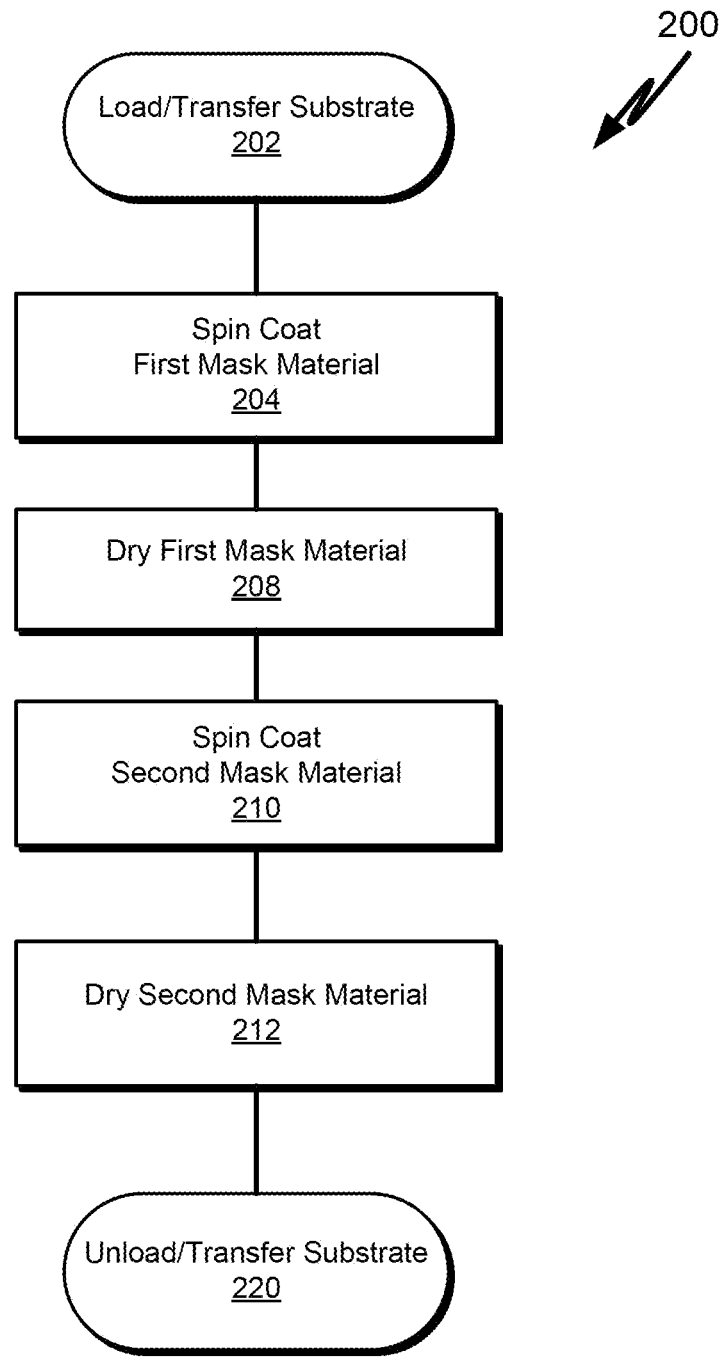
FIG. 2A is a flow diagram illustrating a method of spin coating a multi-layer mask onto a substrate to be diced, in accordance with an embodiment of the present invention.

FIG. 2A is a flow diagram illustrating a masking method 200 for spin coating the first mask material layer 402A onto a substrate to be diced, in accordance with an embodiment of the present invention. At operation 202, a substrate is loaded onto a spin coat system or transferred into a spin coat module of an integrated platform. At operation 204 a polymeric precursor solution is spun over the passivation layer 511 and bump 512. For the exemplary water soluble first mask material layer, the polymeric precursor solution is an aqueous solution. Experiments conducted with spin-on PVA solutions have demonstrated coverage of bumps with a height ($H_B$) of 50 μm.

At operation 208 the wet coat is dried or baked, for example on a hot plate, and the substrate unloaded for laser scribe or transferred in-vaccuo to a laser scribe module. For particular embodiments where the first mask material layer 402A is hygroscopic, in-vaccuo transfer is advantageous. The spin and dispense parameters are a matter of choice depending on the material, substrate topography and desired first mask material layer thickness. The bake temperature and time should be selected to avoid excessive crosslinking which renders removal difficult. Exemplary drying temperatures ranging from 60° C. to 150° C., depending on the material.

In the exemplary embodiment where the first mask material layer 402A is spin-coated (as illustrated in FIG. 2A), the second mask material layer 402B is also spin-coated (at operation 210). For such embodiments, the second mask material layer 402B may be any conventional polymeric material offering suitable resistance to plasma etch, such as, but not limited to, any known photoresist, polyimide (PI), Benzo-Cyclo-Butene (BCB), or the like. The spin and dispense parameters are again a matter of choice depending on the material, substrate topography and desired thickness of the second mask material layer 402B (as a function of etch resistance, etc.). At operation 212, the second mask material layer 402B is dried with a bake temperature and bake time which will avoid excessive crosslinking of the first mask material layer 402A. Exemplary drying temperatures ranging from 60° C. to 150° C., depending on the material. Operation 220 then completes the masking method 200 with the substrate unloaded for subsequent scribing or transferred in-vaccuo to a laser scribe apparatus of an integrated platform.

Figure 2B:
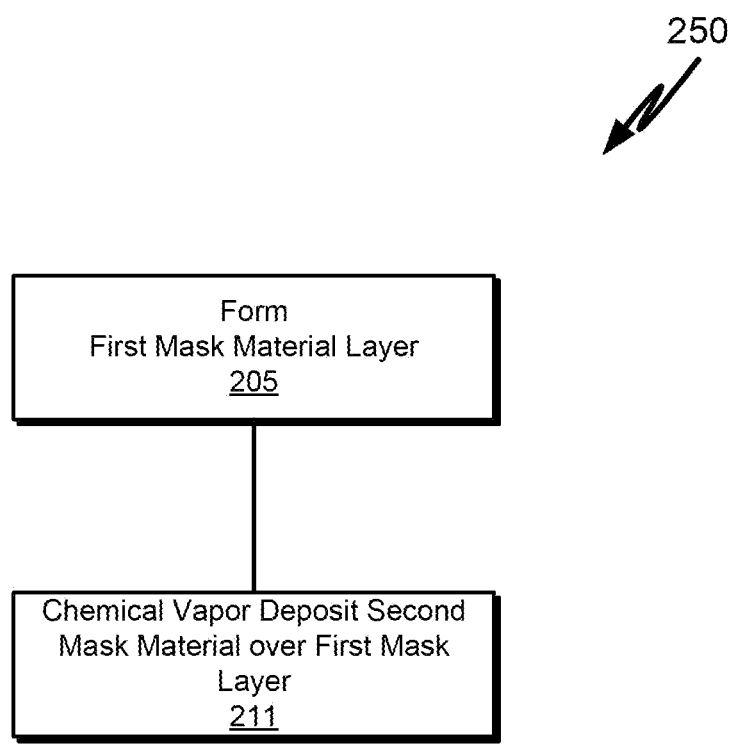
FIG. 2B is a flow diagram illustrating a method of vapor depositing a multi-layer mask to a substrate to be diced, in accordance with an embodiment of the present invention.

In another embodiment, at least one of the first and second mask material layer 402A, 402B are formed by vapor deposition. FIG. 2B is a flow diagram illustrating an exemplary masking method 2B for applying the second mask material layer 402B, in accordance with an embodiment of the present invention. At operation 205, the first mask material layer 402A is formed by any manner described elsewhere herein (e.g., spin coat, spray, vapor deposit, dry laminate). At operation 211, the second mask material layer 402B is formed over the first mask material layer 402A by chemical vapor deposition. In the exemplary embodiment, a low temperature chemical vapor deposition process is employed to form a CVD carbon layer. Because the CVD carbon layer may contain a plurality of bonding states in various proportions, it lacks long rang order and so is commonly referred to as "amorphous carbon." An amorphous carbon material is commercially available from Applied Materials, Inc., CA, U.S.A. under the trade name Advanced Patterning Film™ (APF). In certain embodiments, the amorphous carbon layer is formed with a PECVD process using hydrocarbon precursors, such as, but not limited to, methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetelyne ($C_2H_2$) and mixtures thereof. The CVD carbon material may also include nitrogen or other additives. A low-temperature CVD process is preferable where there is a risk of cross-linking the first mask material layer 402A. For example during deposition of the CVD carbon layer, wafer temperature may be maintained under 150° C., or even under 100° C. if necessary, depending on the first mask material. With moderate plasma ion density, little substrate heating is necessary for a CVD film of sufficient quality to augment the first mask material layer 402A and provide etch resistance of between 1:20 and 1:30 during the subsequent plasma street etch. In the exemplary embodiment where the first mask material 402A is water soluble (e.g., PVA), the second mask material 402B is amorphous carbon deposited with a carbonaceous precursor gas at a temperature below 100° C. Operation 220 then completes the masking method 200 with the substrate unloaded for subsequent scribing or transferred in-vaccuo to a laser scribe apparatus of an integrated platform.

Depending on the embodiment, either of the masking method 200 or masking method 250 may be performed prior to, or subsequent to, a backside grind (BSG) process. As spin coating is generally an accomplished technique for substrates having a conventional thickness of 750 the masking method 200 may be advantageously performed prior to backside grind. However, in the alternative, the masking method 200 is performed subsequent to the backside grind, for example by supporting both a thinned substrate and taped frame upon a rotatable chuck.

Figure 3A:
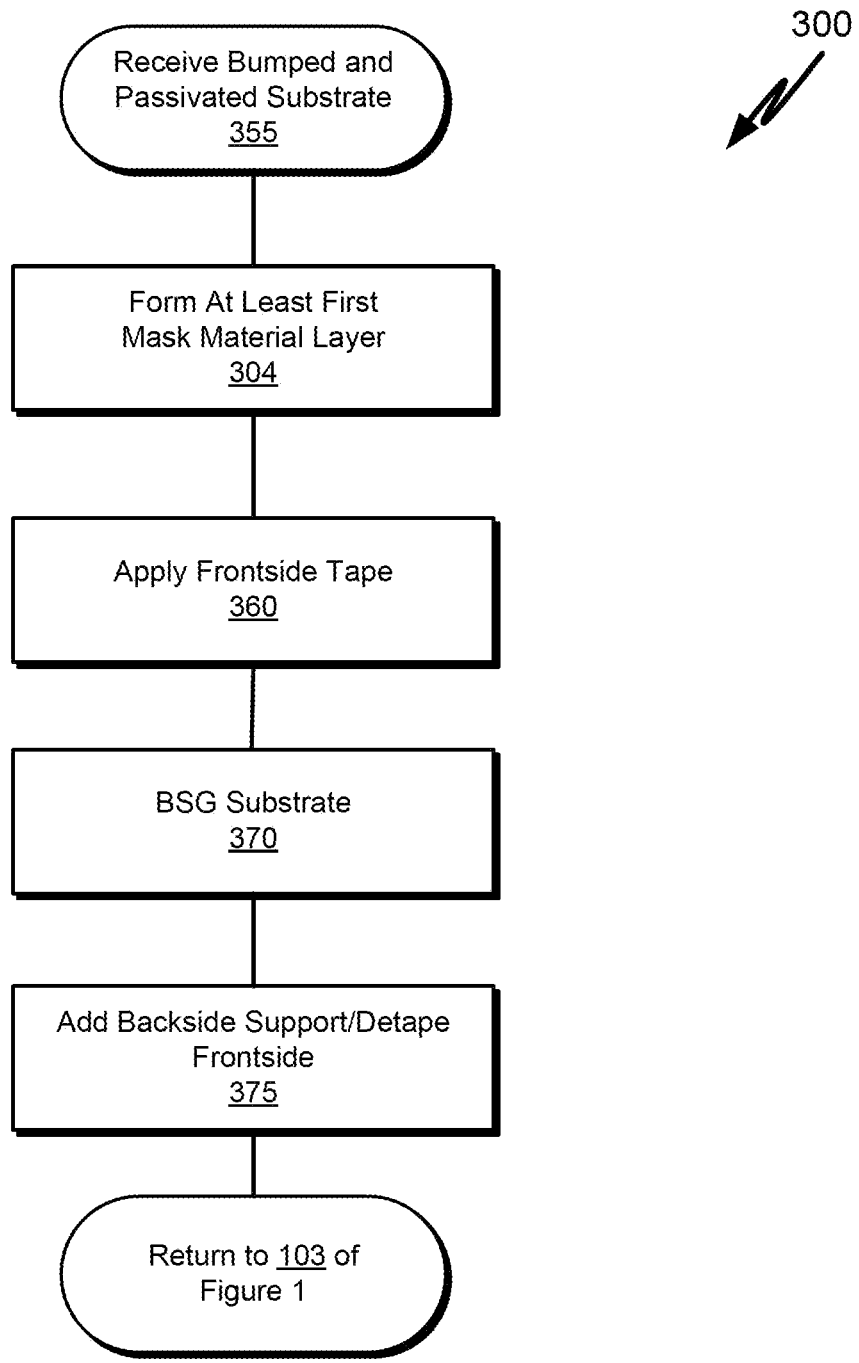
FIG. 3A is a flow diagram illustrating a method of applying a multi-layered mask to a substrate prior to wafer thinning, in accordance with an embodiment of the present invention.

FIG. 3A is a flow diagram illustrating a method 300 for applying the multi-layered mask 402 to a substrate to be diced prior to wafer thinning. Method 300 begins with receiving a bumped and passivated substrate at operation 355. At operation 304, at least the first mask material layer 402A is formed. In a further embodiment, both the first mask material layer 402A and second mask material layer 402B are formed. Operation 304 may therefore entail any of the formation methods described for the first mask material layer and/or the second mask material layer, as described elsewhere herein. At operation 360, frontside tape is applied over at least the first layer of the multi-layered mask 402. Any conventional frontside tape, such as, but not limited to UV-tape, may be applied over the first layer of the multi-layered mask 402. At operation 370, the substrate is thinned from the backside, for example by grinding the bottom surface 502 of the substrate 406 (FIG. 5). At operation 375, a backside support 411 is added to the thinned substrate. For example, the backside tape 410 may be applied and the frontside tape then removed from the substrate with at least the first layer of the multi-layered mask 402 remaining. Method 300 then returns to operation 103 (FIG. 1) to complete the multi-layered masking process or proceed with the hybrid laser ablation-plasma etch singulation method 300, in accordance with embodiments of the present invention.

Figure 3B:
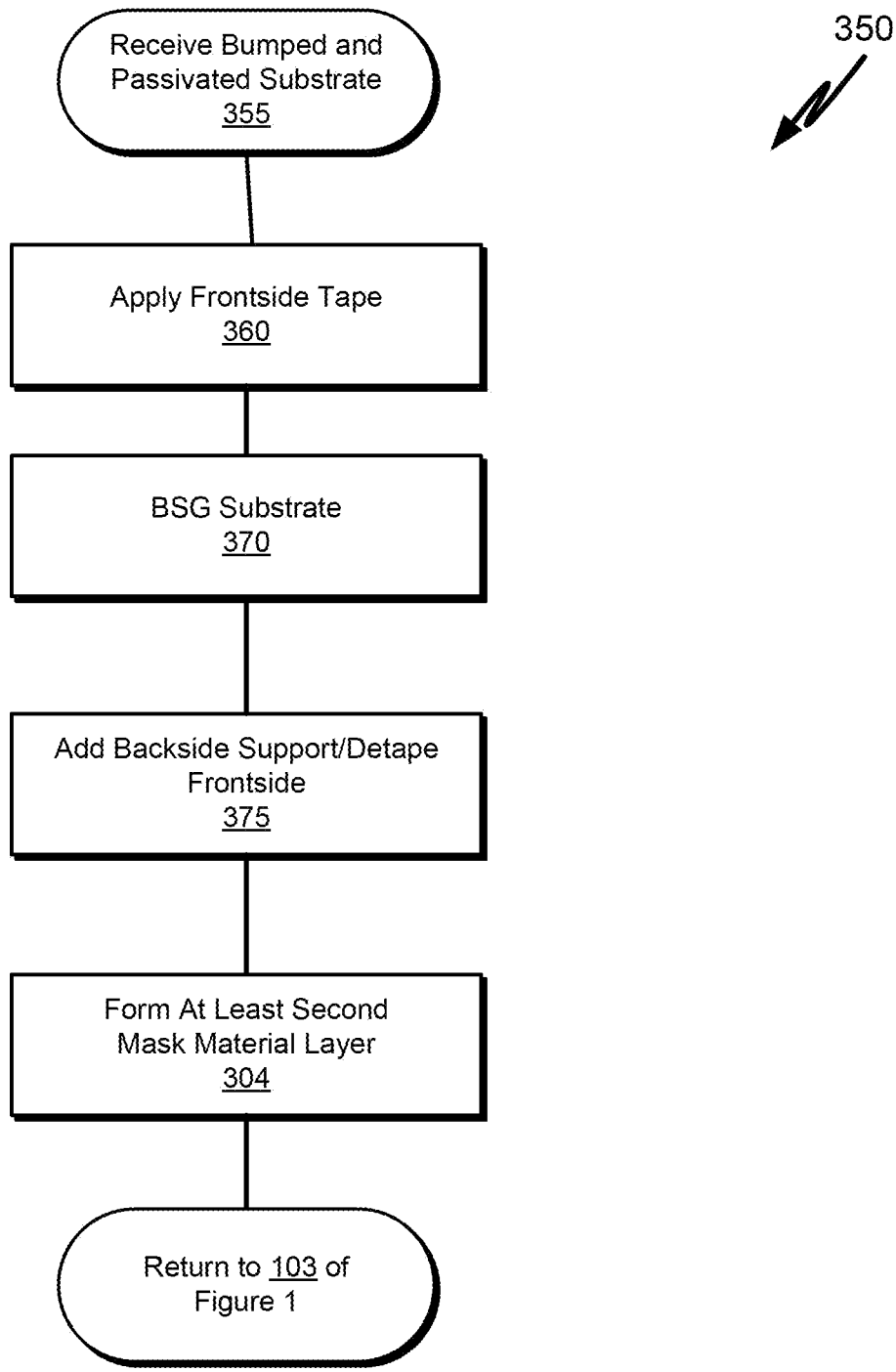
FIG. 3B is a flow diagram illustrating a method of applying a multi-layered mask to a substrate subsequent to wafer thinning, in accordance with an embodiment of the present invention.

FIG. 3B is a flow diagram illustrating a method 350 for applying the multi-layered mask 402 to a substrate to be diced subsequent to wafer thinning. Method 350 begins with receiving a bumped and passivated substrate at operation 355. At the operation 360, any conventional frontside tape, such as, but not limited to UV-tape is applied over the ICs. At operation 370, the substrate is thinned from the backside, for example by grinding the bottom surface 502 of the substrate 406 illustrated in FIG. 5. At operation 375, a backside support 411 is added to the thinned substrate. For example, the backside tape 410 may be applied and the frontside tape then removed from the water soluble mask layer. At operation 304, at least the second mask material layer 402B is then formed (e.g., by spin coat, CVD, dry film lamination, etc.). In a further embodiment, both the first mask material layer 402A and second mask material layer 402B are formed. Operation 304 may again entail any of the formation methods described for the second mask material layer and/or the first mask material layer, as described elsewhere herein. Method 350 then returns to FIG. 1 to proceed with the hybrid laser ablation-plasma etch singulation method 300.

In a further embodiment, the methods 300 and 350 are both practiced with the first mask material layer 402A being formed prior to BSG (as illustrated by FIG. 3A) and the second mask material layer 402B being formed subsequent to BSG (as illustrated by FIG. 3A). In one such embodiment the first mask material layer 402A is applied with the spin-coat technique while the substrate is full thickness and the second mask material layer 402B is applied to a thinned substrate with a non-spin-coat technique, such as vapor deposition. For example, referring to FIG. 3A, a PVA first mask material layer 402A may be applied at operation 304 prior to the frontside taping at operation 360 while a CVD carbon second mask material layer 402B may be applied at operation 304 subsequent to frontside detaping operation 375.

Figure 4B:
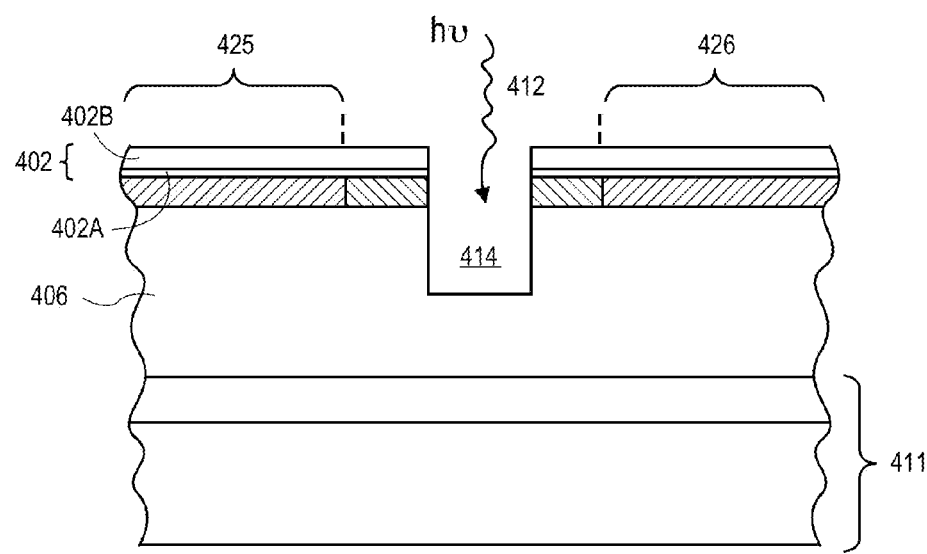
FIG. 4B illustrates a cross-sectional view of a semiconductor substrate including a plurality of ICs corresponding to operation 103 of the dicing method illustrated in FIG. 1, in accordance with an embodiment of the present invention.

Returning now to operation 103 of method 100, and corresponding FIG. 4B, the multi-layered mask 402 is patterned by ablation with a laser scribing process forming trenches 412, extending the subsurface thin film device layers, and exposing regions of the substrate 406 between the ICs 425, 426. As such, the laser scribing process is used to ablate the thin film material of the streets 427 originally formed between the ICs 425, 426. In accordance with an embodiment of the present invention, patterning the multi-layered mask 402 with the laser-based scribing process includes forming trenches 414 partially into the regions of the substrate 406 between the ICs 425, 426, as depicted in FIG. 4B.

In the exemplary embodiment illustrated in FIG. 5, the laser scribing depth $D_L$ is approximately in the range of 5 µms to 50 µms deep, advantageously in the range of 10 µms to 20 µms deep, depending on the thickness $T_F$ of the passivation 511 and subsurface thin film device layers and thickness $T_{max}$ of the multi-layered mask 402.

In an embodiment, the multi-layered mask 402 is patterned with a laser having a pulse width (duration) in the femtosecond range (i.e., $10^{-15}$ seconds), referred to herein as a femtosecond laser. Laser parameters selection, such as pulse width, may be critical to developing a successful laser scribing and dicing process that minimizes chipping, microcracks and delamination in order to achieve clean laser scribe cuts. A laser frequency in the femtosecond range advantageously mitigates heat damage issues relative longer pulse widths (e.g., picosecond or nanosecond). Although not bound by theory, as currently understood a femtosecond energy source avoids low energy recoupling mechanisms present for picosecond sources and provides for greater thermal nonequilibrium than does a nanosecond-source. With nanosecond or picoseconds laser sources, the various thin film device layer materials present in the street 427 behave quite differently in terms of optical absorption and ablation mechanisms. For example, dielectrics layers such as silicon dioxide, is essentially transparent to all commercially available laser wavelengths under normal conditions. By contrast, metals, organics (e.g., low-κ materials) and silicon can couple photons very easily, particularly nanosecond-based or picosecond-based laser irradiation. If non-optimal laser parameters are selected, in a stacked structures that involve two or more of an inorganic dielectric, an organic dielectric, a semiconductor, or a metal, laser irradiation of the street 427 may disadvantageously cause delamination. For example, a laser penetrating through high bandgap energy dielectrics (such as silicon dioxide with an approximately of 9 eV bandgap) without measurable absorption may be absorbed in an underlying metal or silicon layer, causing significant vaporization of the metal or silicon layers. The vaporization may generate high pressures potentially causing severe interlayer delamination and microcracking. Femtosecond-based laser irradiation processes have been demonstrated to avoid or mitigate such microcracking or delamination of such material stacks.

Parameters for a femtosecond laser-based process may be selected to have substantially the same ablation characteristics for the inorganic and organic dielectrics, metals, and semiconductors. For example, the absorptivity/absorptance of silicon dioxide is non-linear and may be brought more in-line with that of organic dielectrics, semiconductors and metals. In one embodiment, a high intensity and short pulse width femtosecond-based laser process is used to ablate a stack of thin film layers including a silicon dioxide layer and one or more of an organic dielectric, a semiconductor, or a metal. In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 450 femtoseconds, although preferably in the range of 50 femtoseconds to 400 femtoseconds.

In certain embodiments, the laser emission spans any combination of the visible spectrum, the ultra-violet (UV), and/or infra-red (IR) spectrums for a broad or narrow band optical emission spectrum. Even for femtosecond laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific embodiment, a femtosecond laser suitable for semiconductor substrate or substrate scribing is based on a laser having a wavelength of approximately less than or equal to 540 nanometers, although preferably in the range of 540 nanometers to 250 nanometers. In a particular embodiment, pulse widths are less than or equal to 400 femtoseconds for a laser having a wavelength less than or equal to 540 nanometers. However, in an alternative embodiment, dual laser wavelengths (e.g., a combination of an IR laser and a UV laser) are used.

In one embodiment, the laser and associated optical pathway provide a focal spot at the work surface approximately in the range of 3 µm to 15 µm, though advantageously in the range of 5 µm to 10 µm. The spatial beam profile at the work surface may be a single mode (Gaussian) or have a beam shaped top-hat profile. In an embodiment, the laser source has a pulse repetition rate approximately in the range of 300 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 1 µJ to 5 µJ. In an embodiment, the laser scribing process runs along a work piece surface at a speed approximately in the range of 500 mm/sec to 5 msec, although preferably approximately in the range of 600 mm/sec to 2 msec.

The scribing process may be run in single pass only, or in multiple passes, but is advantageously no more than two passes. The laser may be applied either in a train of single pulses at a given pulse repetition rate or a train of pulse bursts. In an embodiment, the kerf width of the laser beam generated is approximately in the range of 2 µms to 15 µm, although in silicon substrate scribing/dicing preferably approximately in the range of 6 µm to 10 µm, as measured at a device/silicon interface.

Figure 4C:
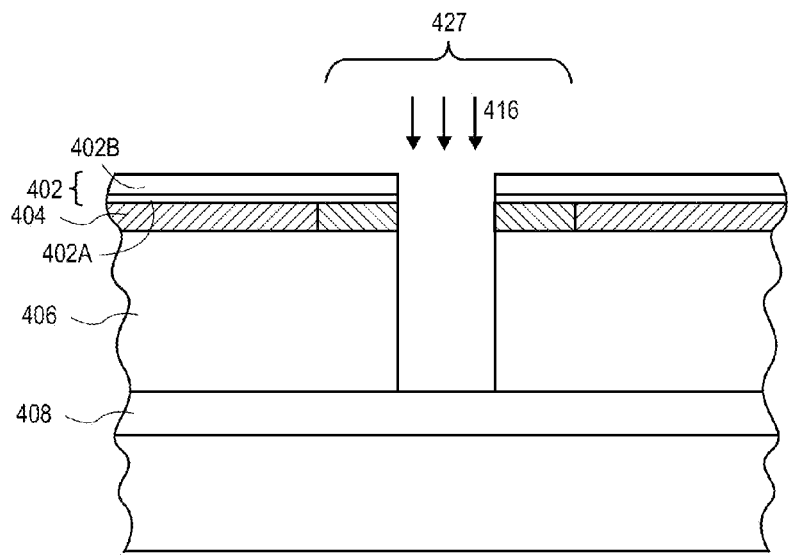
FIG. 4C illustrates a cross-sectional view of a semiconductor substrate including a plurality of ICs corresponding to operation 105 of the dicing method illustrated in FIG. 1, in accordance with an embodiment of the present invention.
Figure 4D:
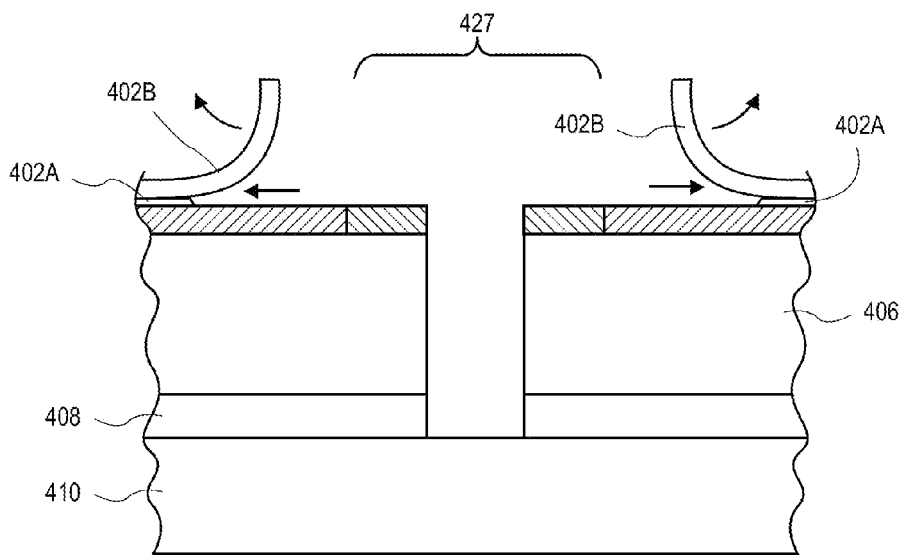
FIG. 4D illustrates a cross-sectional view of a semiconductor substrate including a plurality of ICs corresponding to operation 107 of the dicing method illustrated in FIG. 1, in accordance with an embodiment of the present invention.

Returning to FIGS. 1 and 4C, the substrate 406 is etched through the trenches 412 in the patterned multi-layered mask 402 to singulate the ICs 425, 426. In accordance with an embodiment of the present invention, etching the substrate 406 includes etching the trenches 412 formed with the femtosecond-based laser scribing process to ultimately etch entirely through substrate 406, as depicted in FIG. 4C.

In an embodiment, etching the substrate 406 includes using an anisotropic plasma etching process 416. In one embodiment, a through substrate etch process is used with the second mask material layer 402B protecting the first mask material layer 402A from plasma exposure for the entire duration of plasma etch. In an alternative embodiment, the second mask material layer 402B is consumed during the plasma etch to the point that the first mask layer 402A is exposed to the plasma prior to completion of the etch. A high-density plasma source operating at high powers may be used for the plasma etching operation 105. Exemplary powers range between 3 kW and 6 kW, or more to achieve an etch rate of the substrate 406 that is greater than 25 μms per minute.

In an exemplary embodiment, a deep anisotropic silicon etch (e.g., a through silicon via etch) is used to etch a single crystalline silicon substrate or substrate 406 at an etch rate greater than approximately 40% of conventional silicon etch rates while maintaining essentially precise profile control and virtually scallop-free sidewalls. Effects of the high power on the multi-layered mask (particularly the first mask material layer 402A) are controlled through application of cooling power via an electrostatic chuck (ESC) chilled to −10° C. to −15° C. to maintain the first mask material layer 402A at a temperature below 100° C. and preferably between 70° C. and 80° C. throughout the duration of the plasma etch process. At such temperatures, solubility of the first mask material layer 402A may be advantageously maintained.

In a specific embodiment, the plasma etch entails a plurality of protective polymer deposition cycles interleaved over time with a plurality of etch cycles. The deposition:etch duty cycle may vary with the exemplary duty cycle being approximately 1:1. For example, the etch process may have a deposition cycle with a duration of 250 ms-750 ms and an etch cycle of 250 ms-750 ms. Between the deposition and etch cycles, an etching process chemistry, employing for example $SF_6$ for the exemplary silicon etch embodiment, is alternated with a deposition process chemistry, employing a polymerizing $C_xF_y$ gas such as, but not limited to, $C_4F_6$ or $C_4F_8$. Process pressures may further be alternated between etch and deposition cycles to favor each in the particular cycle, as known in the art.

The hybrid laser ablation-plasma etch singulation method 300 is then completed at operation 107 with removal of the mask layer 402. In the exemplary embodiment illustrated in FIG. 4D, the mask removal operation 107 entails dissolving the first mask material layer 402A selectively to the ICs 425, 426 (e.g., selectively to passivation layer 511, bump 512) as well as selectively to the second mask material layer 402B. The second mask material layer 402B is thereby lifted-off. In one embodiment where the first mask material layer 402A is water soluble, the water soluble mask layer is washed off with a pressurized jet of de-ionized water or through submergence of the substrate in an ambient or heated water bath. In alternative embodiments, the multi-layered mask 402 may be lifted off with aqueous or hydrocarbon solvent solutions known in the art to dissolve the particular material utilized for the first mask material layer 402A. As further illustrated in FIG. 4D, either of the singulation process or mask removal process may further include patterning the die attach film 908, exposing the top portion of the backing tape 910.

Figure 6:
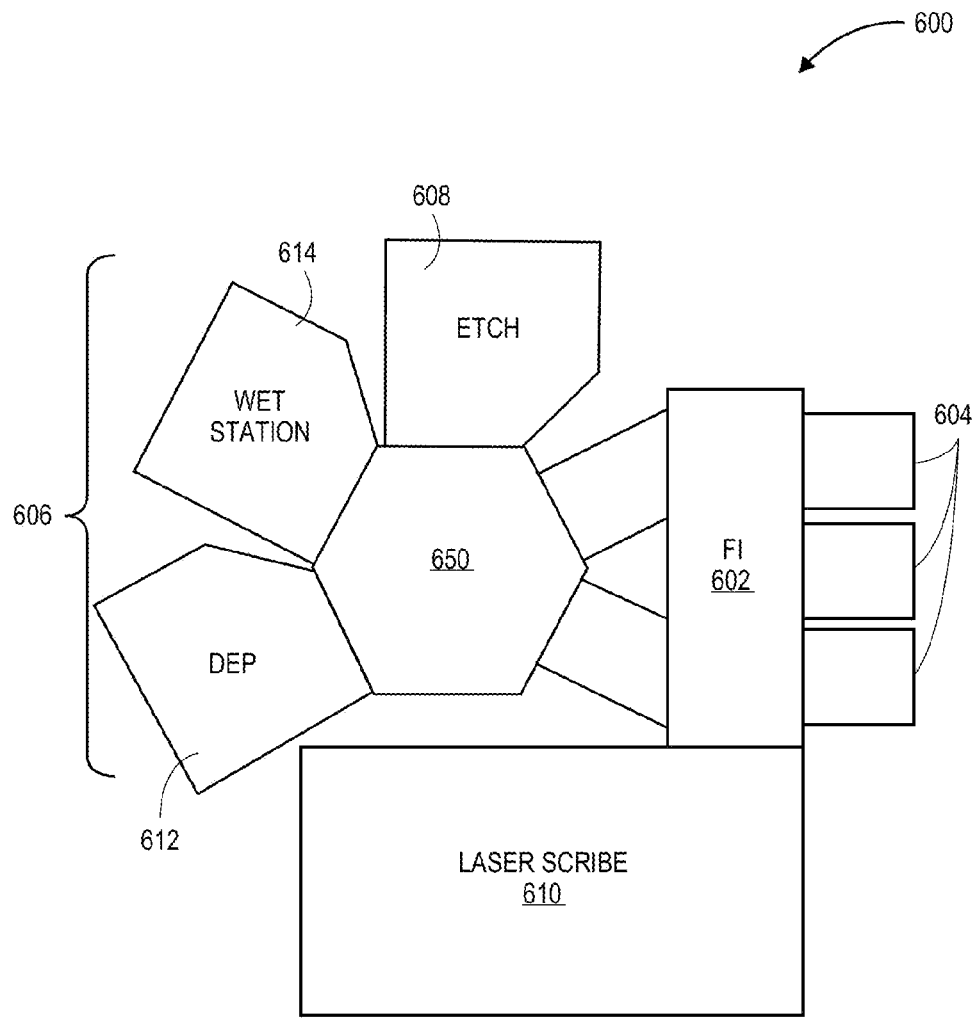
FIG. 6 illustrates a block diagram of a tool layout for laser and plasma dicing of substrates with an integrated deposition module for in-situ application of a multi-layered mask, in accordance with an embodiment of the present invention.

A single integrated platform 600 may be configured to perform many or all of the operations in the hybrid laser ablation-plasma etch singulation process 100. For example, FIG. 6 illustrates a block diagram of a cluster tool 606 coupled with laser scribe apparatus 610 for laser and plasma dicing of substrates, in accordance with an embodiment of the present invention. Referring to FIG. 6, the cluster tool 606 is coupled to a factory interface 602 (FI) having a plurality of load locks 604. The factory interface 602 may be a suitable atmospheric port to interface between an outside manufacturing facility with laser scribe apparatus 610 and cluster tool 606. The factory interface 602 may include robots with arms or blades for transferring substrates (or carriers thereof) from storage units (such as front opening unified pods) into either cluster tool 606 or laser scribe apparatus 610, or both.

A laser scribe apparatus 610 is also coupled to the FI 602. In an embodiment, the laser scribe apparatus 610 includes a femtosecond laser. The femtosecond laser to performing the laser ablation portion of the hybrid laser and etch singulation process 100. In one embodiment, a moveable stage is also included in laser scribe apparatus 610, the moveable stage configured for moving a substrate or substrate (or a carrier thereof) relative to the femtosecond-based laser. In a specific embodiment, the femtosecond laser is also moveable.

The cluster tool 606 includes one or more plasma etch chambers 608 coupled to the FI by a robotic transfer chamber 650 housing a robotic arm for in-vaccuo transfer of substrates. The plasma etch chambers 608 is suitable for performing a plasma etch portion of the hybrid laser and etch singulation process 100. In one exemplary embodiment, the plasma etch chamber 608 is further coupled to an $SF_6$ gas source and at least one of a $C_4F_8$ and $C_4F_6$ source. In a specific embodiment, the one or more plasma etch chambers 608 is an Applied Centura® Silvi*a*™ Etch system, available from Applied Materials of Sunnyvale, Calif., USA, although other suitable etch systems are also available commercially. In an embodiment, more than one etch chamber 608 is included in the cluster tool 606 portion of integrated platform 600 to enable high manufacturing throughput of the singulation or dicing process.

The cluster tool 606 may include other chambers suitable for performing functions in the hybrid laser ablation-plasma etch singulation process 100. In the exemplary embodiment illustrated in FIG. 6, the cluster tool 606 includes both a mask formation module 612 and a solvent wet station 614, though either may be provided in absence of the other. Depending on the embodiment, the mask formation module 612 may be a spin coating module or a chemical vapor deposition (CVD) chamber. As a spin coating module, a rotatable chuck is configured to clamp by vacuum, or otherwise, a thinned substrate mounted on a carrier such as backing tape mounted on a frame. In further embodiments, the spin coating module is fluidly coupled to an aqueous solution source. For CVD chamber embodiments, the mask formation module 612 is configured to deposit a CVD carbon layer. Any commercially available CVD chamber configured for low temperature film depositions may be coupled to a carbon source gas.

Embodiments of the wet station 614 are to dissolve at least the first mask material layer (e.g., 402A) after plasma etching the substrate. The wet station 614 may include for example a pressurized spray jet to dispense water other solvent.

Figure 7:
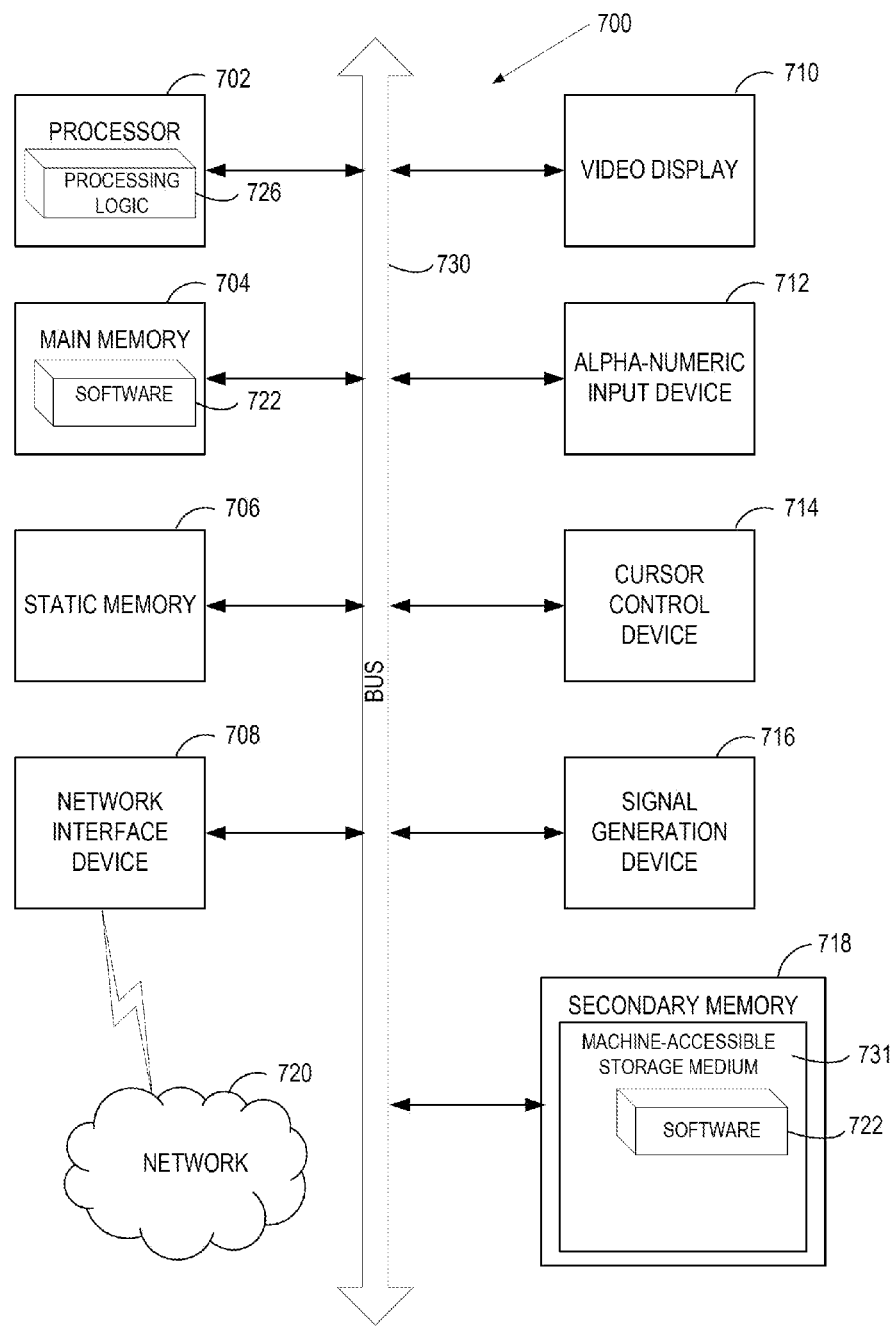
FIG. 7 illustrates a block diagram of an exemplary computer system which controls automated performance of one or more operation in the masking, laser scribing, plasma dicing methods described herein, in accordance with an embodiment of the present invention.

FIG. 7 illustrates a computer system 700 within which a set of instructions, for causing the machine to execute one or more of the scribing methods discussed herein may be executed, for example to analyze a reflected light from a tag to identify at least one micromachine artifact. The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, etc. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

The machine-accessible storage medium 731 may also be used to store pattern recognition algorithms, artifact shape data, artifact positional data, or particle sparkle data. While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, methods of dicing semiconductor substrates, each substrate having a plurality of ICs, have been disclosed. The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is therefore to be determined entirely by the following claims, which are to be construed in accordance with established doctrines of claim interpretation.

What is claimed is:

1. A method of dicing a substrate comprising a plurality of ICs, the method comprising:
   forming a multi-layer mask over the substrate covering and protecting the ICs, the multi-layer mask including a first mask material layer disposed on a top surface of the ICs and a second mask material layer disposed over the first mask material layer;
   patterning the multi-layer mask with a laser scribing process to provide a patterned mask with gaps, exposing regions of the substrate between the ICs;
   plasma etching the substrate through the gaps in the patterned mask to singulate the ICs, wherein the second mask material layer protects the first mask material layer from exposure to the plasma for at least a portion of etching process; and
   dissolving the first mask material layer and lifting the second mask material layer off the top surface of the ICs.

2. The method of claim 1, wherein dissolving the first mask material layer further comprises exposing the multi-layered mask to a solvent in which the first mask material layer is soluble and the second mask material layer is substantially insoluble.

3. The method of claim 2, wherein the solvent is an aqueous solution.

4. The method of claim 3, wherein the solvent is water.

5. The method of claim 1, wherein the first mask material layer comprises a water soluble polymer, and wherein etching the semiconductor substrate comprises etching the trenches with a deep trench etch process during which the first mask material layer is maintained below 100° C.

6. The method of claim 5, wherein the forming the multi-layer mask comprises applying at least one of: poly(vinyl alcohol), poly(acrylic acid), poly(methacrylic acid), poly(acrylamide), or poly(ethylene oxide) as the first mask material layer in contact with the top surface of the IC.

7. The method of claim 1, wherein forming the multi-layer mask comprises applying a non-water soluble polymer over the first mask material layer.

8. The method of claim 7, wherein applying the non-water soluble polymer further comprises applying at least one of photoresist and polyimide.

9. The method of claim 1, wherein forming the mask further comprises forming the multi-layered mask to a thickness of no more than 20 μm over the street between the ICs and at least 10 μm over a top bump surface of an IC.

10. The method of claim 1, wherein patterning the mask further comprises direct writing the pattern with a femtosecond laser having a wavelength less than or equal to 540 nanometers and a laser pulse width less than or equal to 400 femtoseconds.

11. The method of claim 1, wherein forming the multi-layered mask comprises:
   spin coating a solution of the first mask material onto the top surface of the IC; and
   spin coating a solution of the second mask material, or vapor depositing the second mask material, over the first mask material layer.

12. The method of claim 11, further comprising thinning the substrate with a backside grind process, wherein the spin coating of the first mask material is performed after the backside grind.

13. The method of claim 11, wherein spin coating a solution of the second mask material or vapor depositing the second mask material over the first mask material layer further comprises chemical vapor depositing an amorphous carbon layer over the first material.

14. A method of dicing a semiconductor substrate comprising a plurality of ICs, the method comprising:
- forming a water soluble mask material layer over a silicon substrate, the water soluble mask material layer covering the ICs disposed on the silicon substrate, the ICs comprising a thin film stack including a layer of silicon dioxide, a layer of low-K material and a layer of copper;
- forming a non-water soluble mask material layer over the water soluble mask material layer;
- patterning the non-water soluble mask material, the water soluble mask material, the layer of low-K material, and the layer of copper with a femtosecond laser to expose regions of the silicon substrate between the ICs;
- etching the exposed regions of the silicon substrate to singulate the ICs, the non-water soluble mask material layer protecting the water soluble mask material layer from exposure to a plasma from at least a portion of the silicon substrate etching; and
- dissolving the water-soluble mask material layer and lifting off the non-water soluble mask material layer.

15. The method of claim 14, wherein patterning the layer of silicon dioxide, the layer of low-K material, and the layer of copper with the femtosecond laser comprises ablating the layer of silicon dioxide prior to ablating the layer of low-κ material and the layer of copper and wherein etching the silicon substrate comprises exposing the substrate to a plasma of $SF_6$ and at least one of $C_4F_8$ and $C_4F_6$ while maintaining the water soluble mask material layer at a temperature below 100° C.

* * * * *

UNITED STATES PATENT AND TRADEMARK OFFICE
CERTIFICATE OF CORRECTION

PATENT NO. : 8,557,682 B2  
APPLICATION NO. : 13/161427  
DATED : October 15, 2013  
INVENTOR(S) : James M. Holden et al.

Page 1 of 1

It is certified that error appears in the above-identified patent and that said Letters Patent is hereby corrected as shown below:

In the Specification:

Col. 3, Line 40 delete "my" and insert --may--.

Col. 12, Line 15 delete "performing" and insert --perform--.

Col. 12, Line 19 delete "or substrate".

Signed and Sealed this
Eleventh Day of February, 2014

Michelle K. Lee
*Deputy Director of the United States Patent and Trademark Office*